(12) United States Patent
Lau

(10) Patent No.: US 12,322,525 B2
(45) Date of Patent: Jun. 3, 2025

(54) CONTINUOUS, LONG FIBER SILCON CARBIDE FIBER REINFORCEMENT FOR HIGH TEMPERATURE SUPERCONDUCTORS, PRE-STRESSING THE FIBER FOR INCREASED STRENGTH, AND USING A FIBER NETWORK FOR 4D CONTROL OF MICRO-MAGENTIC AND MICRO-ELECTRIC FIELDS

(71) Applicant: LAU Superconductors Inc., Hunt Valley, MD (US)

(72) Inventor: Wayne Chung Wei Lau, Geneva (CH)

(73) Assignee: LAU Superconductors Inc., Hunt Valley, MD (US)

(*) Notice: Subject to any disclaimer, the term of this patent is extended or adjusted under 35 U.S.C. 154(b) by 46 days.

(21) Appl. No.: 18/225,005

(22) Filed: Jul. 21, 2023

(65) Prior Publication Data
US 2023/0377774 A1    Nov. 23, 2023

Related U.S. Application Data

(63) Continuation of application No. 16/656,200, filed on Oct. 17, 2019, now Pat. No. 11,763,966.

(60) Provisional application No. 62/766,483, filed on Oct. 22, 2018, provisional application No. 62/766,484, filed on Oct. 22, 2018, provisional application No. 62/766,485, filed on Oct. 22, 2018.

(51) Int. Cl.
| | | |
|---|---|---|
| H01B 12/00 | (2006.01) |
| H01B 12/10 | (2006.01) |
| H01B 12/16 | (2006.01) |
| H01B 13/00 | (2006.01) |
| H01F 6/06 | (2006.01) |
| H01F 41/04 | (2006.01) |
| H10N 60/01 | (2023.01) |
| H10N 60/85 | (2023.01) |

(52) U.S. Cl.
CPC ............. *H01B 12/10* (2013.01); *H01B 12/16* (2013.01); *H01B 13/0016* (2013.01); *H01F 6/06* (2013.01); *H01F 41/048* (2013.01); *H10N 60/0128* (2023.02); *H10N 60/857* (2023.02)

(58) Field of Classification Search
CPC ...... H01B 12/00; H01B 12/16; H10N 60/857; H10N 60/0128
See application file for complete search history.

(56) References Cited

U.S. PATENT DOCUMENTS

| | | | |
|---|---|---|---|
| 2001/0017220 A1 | 8/2001 | Nakahara | |
| 2002/0173428 A1 | 11/2002 | Thieme | |
| 2006/0258539 A1* | 11/2006 | Matsumoto | ........... C23C 14/087 505/100 |

(Continued)

*Primary Examiner* — Paul A Wartalowicz
(74) *Attorney, Agent, or Firm* — Van Pelt, Yi & James LLP

(57) ABSTRACT

A method comprises disposing one or more continuous fibers, wherein the one or more continuous fibers are at least partially embedded in high temperature superconducting component powders. The fiber of the one or more continuous fibers comprises a curved fiber that comprises a hoop or a spiral. The method further comprises heating the high temperature superconducting component powders and the one or more continuous fibers and cooling the high temperature superconducting component powders and the one or more continuous fibers. The cooling generates a high temperature superconducting material.

17 Claims, 15 Drawing Sheets

(56) References Cited

U.S. PATENT DOCUMENTS

| | | | |
|---|---|---|---|
| 2008/0170982 A1* | 7/2008 | Zhang | C01B 32/154 423/447.3 |
| 2009/0081456 A1 | 3/2009 | Goyal | |
| 2009/0258787 A1 | 10/2009 | Wilkie | |
| 2010/0081574 A1 | 4/2010 | Goyal | |
| 2011/0064909 A1 | 3/2011 | Alderson | |
| 2015/0045229 A1 | 2/2015 | Mitsuhashi | |
| 2017/0133336 A1 | 5/2017 | Oliver | |

* cited by examiner

CONTINUOUS, LONG FIBER SILCON CARBIDE FIBER REINFORCEMENT FOR HIGH TEMPERATURE SUPERCONDUCTORS, PRE-STRESSING THE FIBER FOR INCREASED STRENGTH, AND USING A FIBER NETWORK FOR 4D CONTROL OF MICRO-MAGENTIC AND MICRO-ELECTRIC FIELDS

CROSS REFERENCE TO OTHER APPLICATIONS

This application is a continuation of U.S. patent application Ser. No. 16/656,200 entitled CONTINUOUS, LONG FIBER SILCON CARBIDE FIBER REINFORCEMENT FOR HIGH TEMPERATURE SUPERCONDUCTORS, PRE-STRESSING THE FIBER FOR INCREASED STRENGTH, AND USING A FIBER NETWORK FOR 4D CONTROL OF MICRO-MAGENTIC AND MICRO-ELECTRIC FIELDS filed Oct. 17, 2019 which is incorporated herein by reference for all purposes.

U.S. patent application Ser. No. 16/656,200 claims priority to U.S. Provisional Patent Application No. 62/766,483 entitled THE APPLICATION OF CONTINUOUS, LONG FIBER SILCON CARBIDE FIBER REINFORCEMENT FOR HIGH TEMPERATURE SUPERCONDUCTORS: 4D CONTROL OF MICRO-MAGENTIC AND MICRO-ELECTRIC FIELDS, filed 22 Oct. 2018 which is incorporated herein by reference for all purposes.

U.S. patent application Ser. No. 16/656,200 claims priority to U.S. Provisional Patent Application No. 62/766,484 entitled THE APPLICATION OF CONTINUOUS LONG FIBER SILCON CARBIDE FIBER REINFORCEMENT FOR HIGH TEMPERATURE SUPERCONDUCTORS: PRE-STRESSING FIBER FOR INCREASED STRENGTH, filed 22 Oct. 2018 which is incorporated herein by reference for all purposes.

U.S. patent application Ser. No. 16/656,200 claims priority to U.S. Provisional Patent Application No. 62/766,485 entitled CONTINUOUS, LONG FIBER SILCON CARBIDE FIBER REINFORCEMENT FOR HIGH TEMPERATURE SUPERCONDUCTORS, filed 22 Oct. 2018 which is incorporated herein by reference for all purposes.

BACKGROUND OF THE INVENTION

The first high-temperature superconductor (HTS) was discovered in 1986. Its discoverers were immediately awarded the 1987 Nobel Prize in Physics partly because of expectations for rapid application. Superconductivity is the property of transmitting electricity with no or little resistance. In theory, superconducting materials can also create unlimitedly large magnetic fields.

The HTS break-through was the discovery of superconductivity in ceramic materials. Previously superconductivity was seen only in metallic superconductors which needed to be cooled below 30 K (−243.2° C.) to achieve superconductivity. Such temperatures could in practice be obtained using liquid helium or liquid hydrogen which are expensive to use, increasingly rare in the case of helium, and/or dangerously explosive in the case of hydrogen. In contrast, HTS can achieve superconductivity at temperatures as high as 138 K (−135° C.) and can be cooled using substances such as liquid nitrogen, which is commercially widely available, stable, and inexpensive.

Unfortunately after over three decades of intense experimental and theoretical research, with over 100,000 published papers on the subject and numerous early patents (nearly all expired), no widely accepted theory explains the properties of HTS materials, and no significant HTS applications have been found to be practical.

This reflects four problems: 1) unlike metals which are commonly used to transmit electricity, HTS ceramics are brittle making them expensive to manufacture and difficult to form into wires and other useful shapes; 2) highest performing HTSs are single crystals (bulk) superconductors where the entire sample is a single molecular lattice where superconductivity fails with the slightest lattice crack, 3) HTS do not form large, continuous superconducting domains, but clusters of micro-domains within which superconductivity occurs; and 4) the HTS production process is complicated requiring a multiple calcination of ingredients at high temperatures range from 800° C. to 950° C. for several hours following sintering, which is done at 950° C. in an oxygen atmosphere where oxygen stoichiometry is very crucial for obtaining the superconducting compound. Slow cooling in an oxygen atmosphere turns the material superconductive involving both the uptake and loss of oxygen.

The complex role of oxygen in production prohibits the use of most reinforcing materials to relieve the brittleness and cracking described in 1), 2), and 3) above. This is because nearly all potential materials, which are stable across this process' high temperature such as metals, carbon, composites, ceramics, etc., oxidize during this process which interferes with the creation of the HTS material. The oxidation either creates impurities or depletes oxygen at critical times in the production process and crystal formation.

Current attempts to find useful HTS materials focus on external reinforcement such as packing-in-tube (PIT) wire production, encasing HTS in durable materials like stainless steel, or additive processes such as attempting to apply HTS as a coating on film or tape substrates. Both PIT and external encasing are difficult to produce economically in shapes and constructions for practical applications. Techniques which attempt to grow HTS on reinforcement substrates are experimental and, to date, far from producing significantly robust HTS components for practical applications. Attempts have been made to use HTS in electrical applications such as transformers and Superconductor Fault Control Limiters where strength is not critical. But these have not yet resulted in widespread HTS use due to technical and economic reasons.

Attempts have been made to internally reinforce HTS using discontinuous metal fibers (also known as chopped fibers) and particles (Cu, Ag, Au, etc.). These have generally failed due to a) contamination during production as described in 0009 above and/or b) agglomeration of the discontinuous particles/fibers during the melt phase of production. In agglomeration sintering powders are melted into liquid form. While in liquid discontinuous reinforcement pieces can move and stick together (agglomerate) forming masses which disrupt crystal formation, and create crack and fault planes which reduces the strength of and disintegrates the final HTS crystal.

BRIEF DESCRIPTION OF THE DRAWINGS

Various embodiments of the invention are disclosed in the following detailed description and the accompanying drawings.

DETAILED DESCRIPTION

Figure 1:
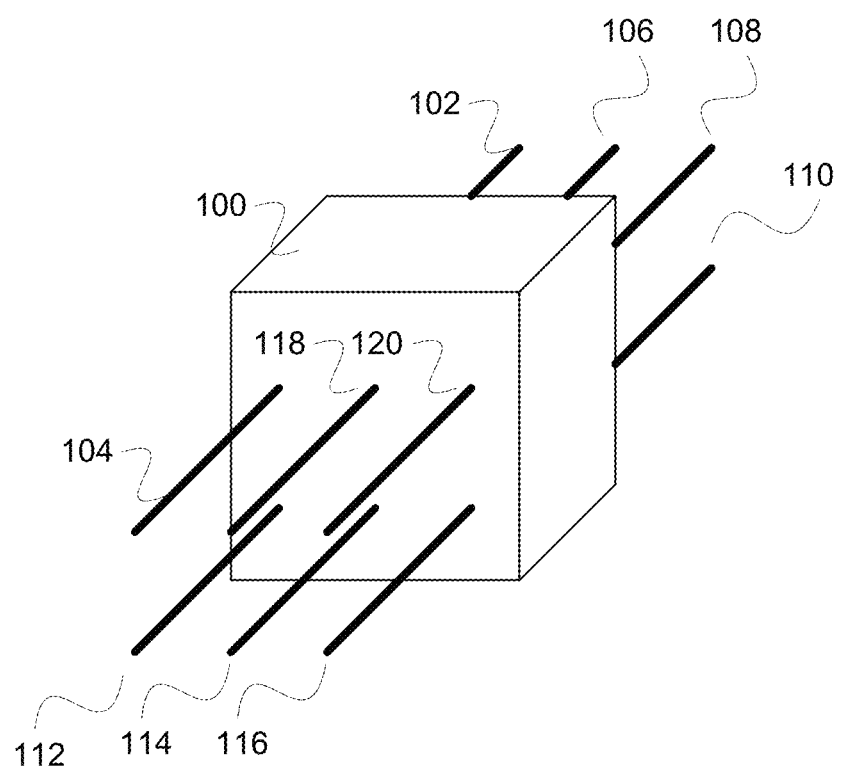
FIG. 1 is a diagram illustrating an embodiment of continuous, long fibers placed in a simple one dimensional array embedded in a HTS to reinforce a HTS.

The invention can be implemented in numerous ways, including as a process; an apparatus; a system; a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A composition is disclosed. One or more continuous fibers is/are embedded in a high temperature superconducting material.

In some embodiments, the one or more continuous fibers is comprised of an element which a) has a high melting point and b) forms a very durable oxide form that prevents contamination of a high temperature superconducting material. In some embodiments, the one or more continuous fibers comprise SiC fiber. In various embodiments, the one or more fibers comprise Silicon (Si), Silicon Nitride ($Si_3N_4$), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminium (Al), Aluminum Carbide ($Al_4C_3$), Aluminium Nitride (AlN), Titanium Aluminium Nitride (TiAlN), Aluminium Titanium Nitride (AlTiN), or any other appropriate material.

A reinforced high temperature superconducting material is disclosed. The high temperature superconducting material has zero electrical resistance at a temperature above 25° K. In some embodiments, the high temperature superconducting material comprises one or more of the following: a ceramic material, a copper oxide material, an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, or any other appropriate material. These materials are typically made by heating the component powders in the appropriate proportions until they anneal and then cooling until a crystal is formed.

The one or more continuous fibers are arranged in an array. In various embodiments, the array comprises one of the following: a one dimensional array, a two dimensional array, a three dimensional array, or any other appropriate array. In some embodiments, the two or more continuous fibers are connected or coupled to each other. In some embodiments, the two or more continuous fibers are not connected nor coupled to each other. In various embodiments, the one or more fibers are arranged in parallel lines, in parallel curves, or any other appropriate reinforcement arrangement.

In various embodiments, the high temperature superconductive material is shaped using subtractive cutting, is shaped using cutting and dividing, or any other process for creating a shape. In various embodiments, the high temperature superconductive material is produced using a batch process, a continuous process, or any other appropriate process.

In some embodiments, the one or more fibers are pre-stressed during manufacturing. In various embodiments, the one or more fibers are used for cooling the high temperature superconducting material, are used to heat the high temperature superconducting material, are used to transmit electrical signals into the high temperature superconducting material, or any other appropriate use within the high temperature superconducting material.

Continuous, long fiber is used for physical internal reinforcement of an HTS material to prevent contamination during crystal formation and cracking of the final crystal which causes the superconductivity of HTS material to fail.

Long continuous fiber is distributed through the HTS sintering components powder then processed with the HTS sample through a sintering, crystallization, and cooling process.

FIG. 1 is a diagram illustrating an embodiment of continuous, long fibers placed in a simple one dimensional array embedded in a HTS to reinforce a HTS. In the example shown, long continuous fiber 102 extends outside one side of high temperature superconducting material 100 and extends outside the other side of high temperature superconducting material 100 (e.g., long continuous fiber 104). Long continuous fiber 106 extends outside one side of high temperature superconducting material 100 and extends outside the other side of high temperature superconducting material 100 (e.g., long continuous fiber 118). Long continuous fiber 108 extends outside one side of high temperature superconducting material 100 and extends outside the other side of high temperature superconducting material 100 (e.g., long continuous Si C fiber 120). Long continuous fiber 110 extends outside one side of high temperature superconducting material 100 and extends outside the other side of high temperature superconducting material 100 (e.g., long continuous fiber 116). Long continuous fiber 104, long continuous fiber 118, long continuous fiber 120, long continuous fiber 112, long continuous fiber 114, and long continuous fiber 116 are arranged in parallel and in a one dimensional array (e.g., all fibers aligned along a single dimension). In some embodiments, long continuous fiber 104, long continuous fiber 118, long continuous fiber 120, long continuous fiber 112, long continuous fiber 114, and long continuous fiber 116 do not move significantly during melt liquid phase of manufacturing.

In some embodiments, carbon fiber (e.g., SiC fiber) is a strong reinforcing material which is stable over the wide range of temperatures involved in sintering, crystallizing and processing bulk HTS crystal;

In some embodiments, although oxygen reacts readily with most materials, the specified fibers create a durable oxide layer that prevents contamination of a high temperature superconducting material. For example, SiC carbon fiber creates a durable layer of silicon dioxide ($SiO_2$) from a reaction of silicon Si with oxygen O during the initial heating of the HTS sintering, in which the component powders are melted into a liquid phase. This $SiO_2$ layer prohibits further reaction with oxygen during the remaining HTS production process. This process is similar to how aluminum (Al), which normally reacts readily with oxygen, forms a durable coat of aluminum oxide $Al_2O_3$, which prevents further reactions. The oxide layer allows aluminum to be used safely for foil, pots, and pans without the fear of either an explosive chemical reaction or aluminum poisoning (except in the case of highly acidic foods like rhubarb which can dissolve the $Al_2O_3$ coating during cooking).

In some embodiments, the use of continuous, long fiber permitting the to retain its position in the metal phase liquid, prevents the agglomeration seen with discontinuous fibers and particles which ultimately weakens and disintegrates the HTS crystal.

In various embodiments, continuous, long fiber can be formed into a variety of simple reinforcement structures involving unconnected fibers such as single planes of one dimensional fiber arrays, two dimensional fiber arrays with alternating stacked layers of planes in orthogonal directions, full three dimensional unconnected arrays or lattices of fibers, or any other appropriate reinforcement arrangements.

Figure 2A:
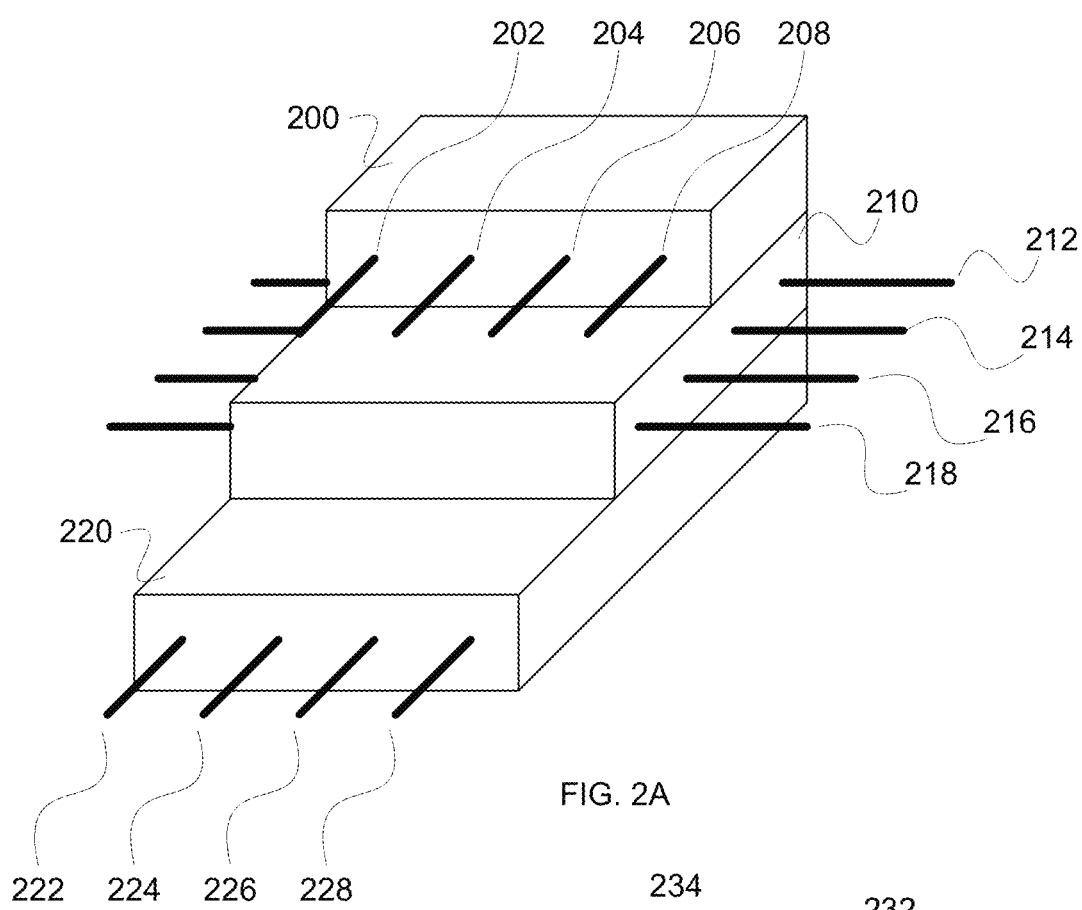
FIG. 2A is a diagram illustrating an embodiment of layered planes of two dimensional unconnected continuous, long fibers placed in a layered two dimensional array embedded in a HTS to reinforce a HTS.

FIG. 2A is a diagram illustrating an embodiment of layered planes of two dimensional unconnected continuous, long fibers placed in a layered two dimensional array embedded in a HTS to reinforce a HTS. In the example shown, long continuous fiber 202, long continuous fiber 204, long continuous fiber 206, and long continuous fiber 208 extend in parallel through a high temperature superconducting material in layer 200. Long continuous fiber 212, long continuous fiber 214, long continuous fiber 216, and long continuous fiber 218 extend in parallel through a high temperature superconducting material in layer. Long continuous fiber, long continuous fiber, long continuous fiber 226, and long continuous fiber 228 extend in parallel through a high temperature superconducting material in layer 220. The fibers in layer 200 are perpendicular to layer 210. The fibers in layer 210 are perpendicular to layer 220. The fibers in layer 200, layer 210, and in layer 220 do not move significantly during melt liquid phase of manufacturing.

Figure 2B:
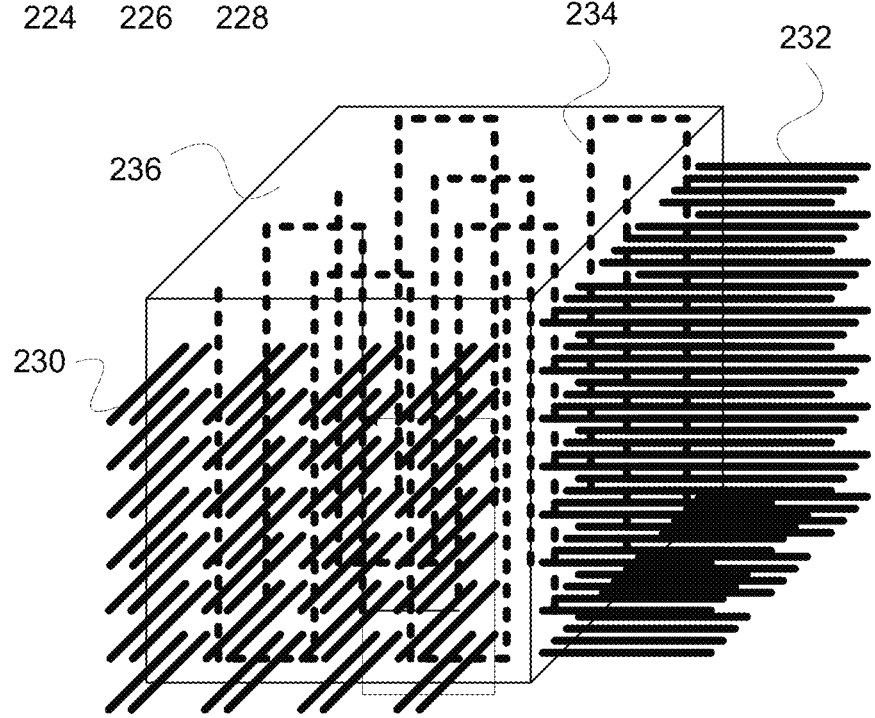
FIGS. 2B and 2C are diagrams illustrating an embodiment of three dimensional unconnected fiber lattices.
Figure 2C:
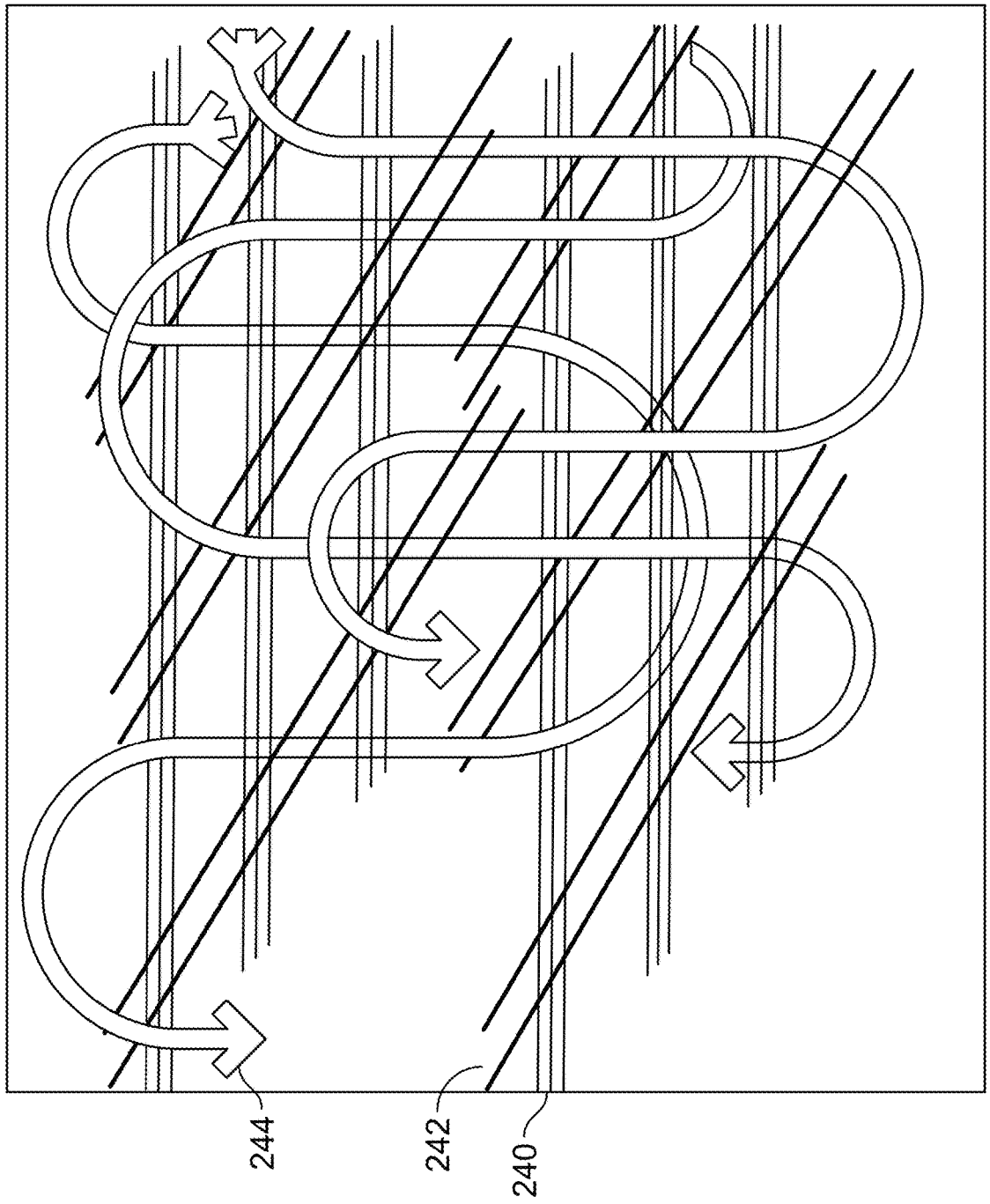
Figure 3A:
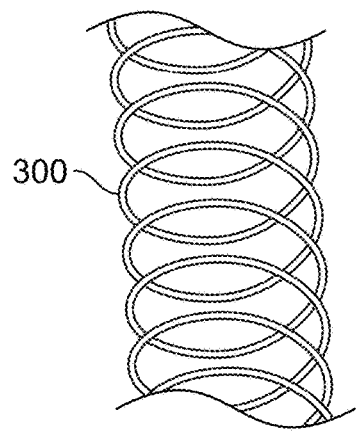
FIGS. 3A, 3B, 3C, and 3D are diagrams illustrating embodiments of unconnected, continuous, long fibers placed in non-linear geometries such as circular hoops and spirals to reinforce HTS.
Figure 3B:
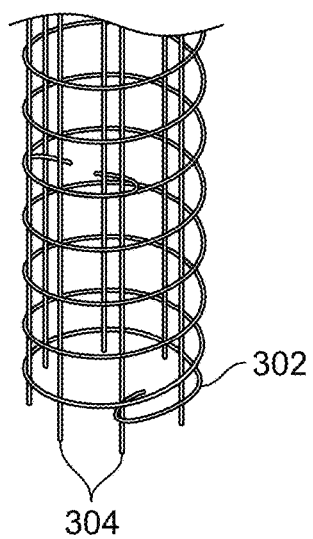
Figure 3C:
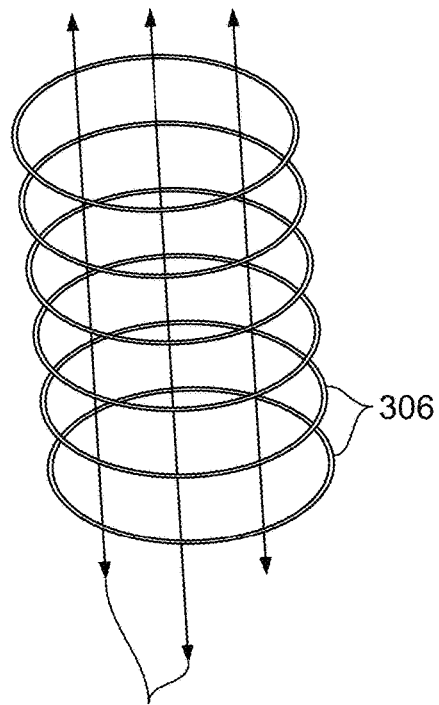
Figure 3D:
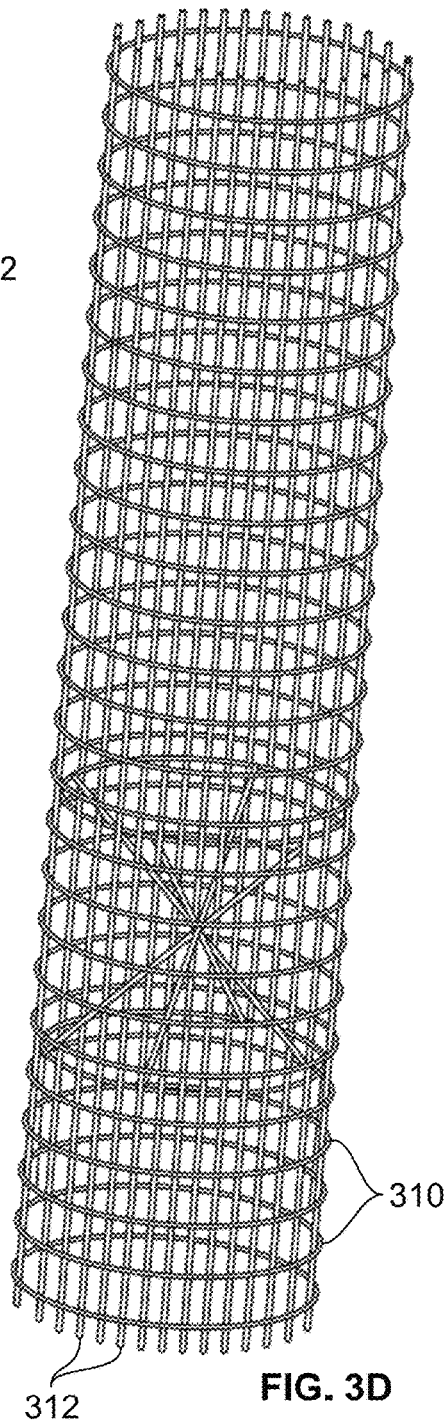
Figure 4A:
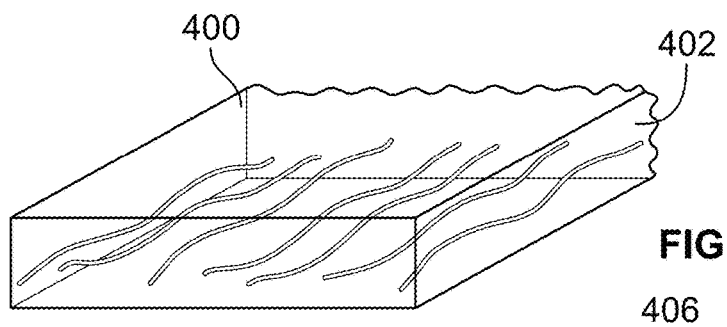
FIGS. 4A, 4B, 4C, 4D, and 4E are diagrams illustrating embodiments of connected continuous, long fibers placed in two dimensional and three dimensional reinforcement structures.
Figure 4B:
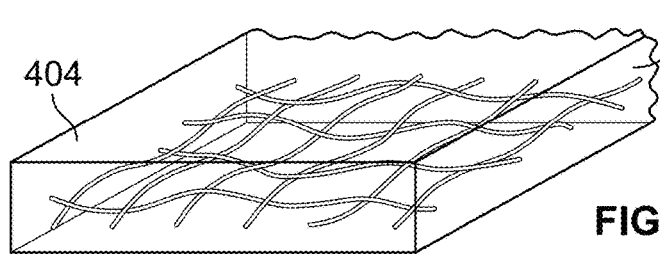
Figure 4C:
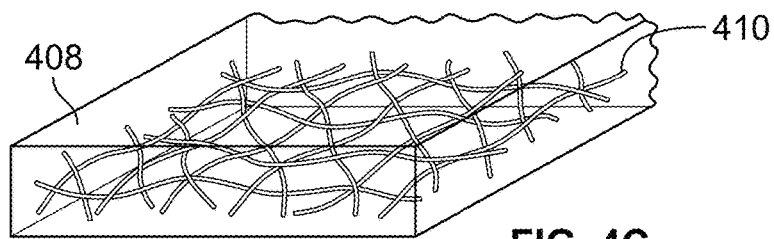
Figure 4D:
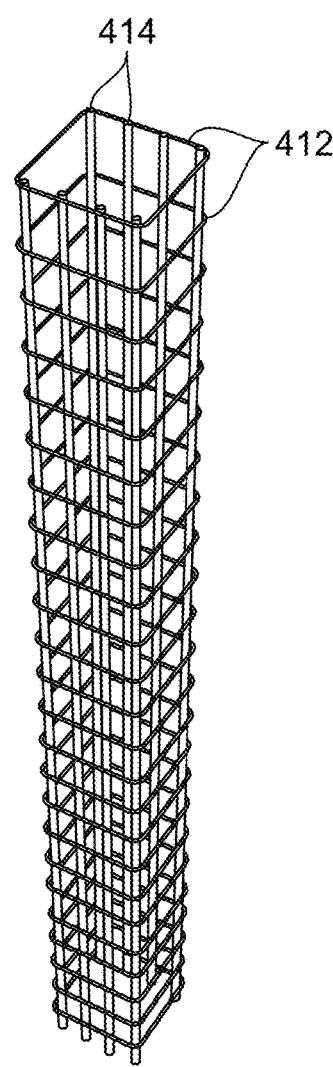
Figure 4E:
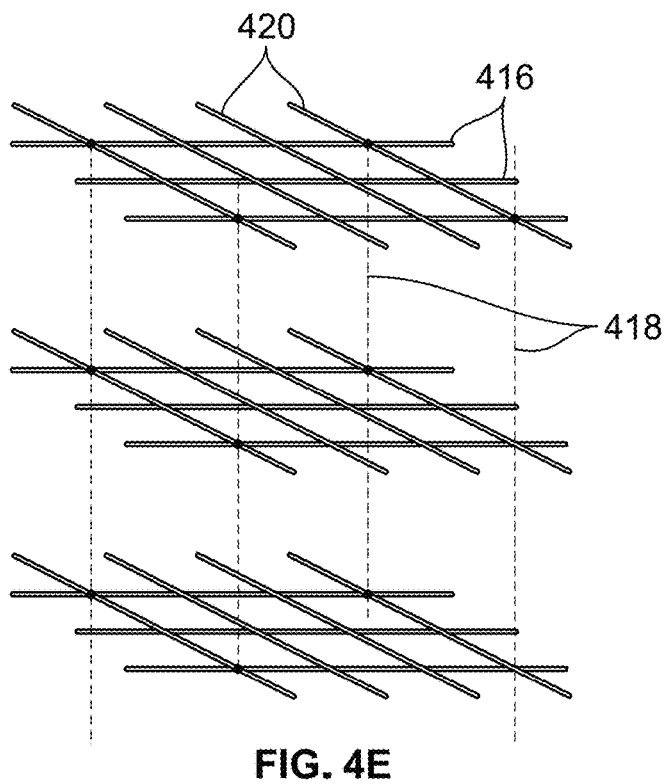

FIGS. 2B and 2C are diagrams illustrating an embodiment of three dimensional unconnected fiber lattices. In the example shown in FIG. 2B, long continuous fiber 230 is representative of many fibers extending in parallel through a high temperature superconducting material 236. Long continuous fiber 232 is representative of many fibers extending in parallel through a high temperature superconducting material 236, but orthogonal through long continuous fiber 230. In addition, long continuous fiber 234 and similar fibers are wrapped mostly orthogonal to long continuous fiber 230 and to long continuous fiber 232. In FIG. 2C, long continuous fiber 240 is representative of many fibers extending in parallel through a high temperature superconducting material (not shown so that fibers are easier to visualize). Long continuous fiber 242 is representative of many fibers extending in parallel through a high temperature superconducting material, but orthogonal through long continuous fiber 240. In addition, long continuous fiber 244 and similar fibers are wrapped mostly orthogonal to long continuous fiber 240 and to long continuous fiber 242.

FIGS. 3A, 3B, 3C, and 3D are diagrams illustrating embodiments of unconnected, continuous, long fibers placed in non-linear geometries such as circular hoops and spirals to reinforce HTS. In the example shown in FIG. 3A, reinforcement long spiral fiber 300 is illustrated without surrounding HTS material (e.g., material in a cylindrical shape such as a column). In the example shown in FIG. 3B, reinforcement long spiral fiber 302 is illustrated with long, continuous parallel fibers 304 along the axis of the spiral without surrounding HTS material (e.g., material in a cylindrical shape such as a column). In the example shown in FIG. 3C, reinforcement parallel hoops of fiber 306 are illustrated with long, continuous parallel fibers 308 along the axis of the parallel hoops without surrounding HTS material (e.g., material in a cylindrical shape such as a column). In the example shown in FIG. 3C, reinforcement parallel hoops of fiber 310 are illustrated with long, continuous parallel fibers 312 along the axis of the parallel hoops without surrounding HTS material (e.g., material in a cylindrical shape such as a column).

By connecting continuous, long fiber, a variety of reinforcement structures like single and layered two dimensional nets as well as three dimensional connected mesh structures can be made.

FIGS. 4A, 4B, 4C, 4D, and 4E are diagrams illustrating embodiments of connected continuous, long fibers placed in two dimensional and three dimensional reinforcement structures. In the example shown in 4A, a plurality of fibers such as continuous, long fiber 402 are parallel and are used to reinforce HTS material 400. In the example shown in 4B, a plurality of fibers such as an orthogonal mesh of continuous, long fibers 406 are parallel and are used to reinforce HTS material 404. In the example shown in 4C, a plurality of fibers such as a three direction mesh of continuous, long fibers 410 (e.g., orthogonal mesh plus 45 degree lines) are used to reinforce HTS material 408. In the example shown in 4D, a plurality of fibers such as parallel continuous, long fibers 414 and parallel square hoops 412 are used to reinforce an HTS material (not shown in FIG. 4D). In the example shown in 4E, a plurality of fibers such as parallel continuous, long fibers 420, orthogonal parallel continuous, long fibers 416, and orthogonal parallel long fibers 418 are used to reinforce an HTS material (not shown in FIG. 4E).

By using both linear and non-linear, unconnected and connected continuous long fiber, complex reinforcement structures can be formed for any desired geometry of HTS superconductor.

Figure 5A:
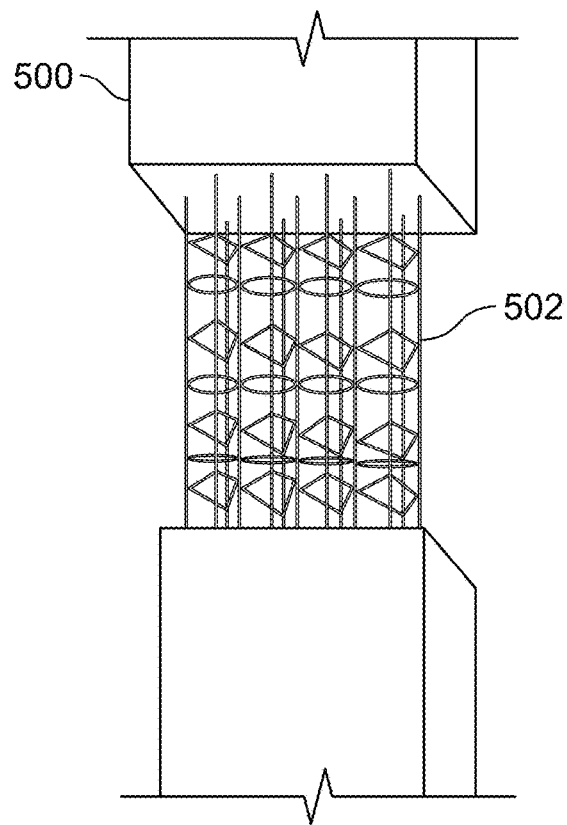
FIGS. 5A and 5B are diagrams illustrating embodiments of a complex examples of combined linear and non-linear, connected and unconnected continuous, long fibers placed in HTS reinforcement structures.
Figure 5B:
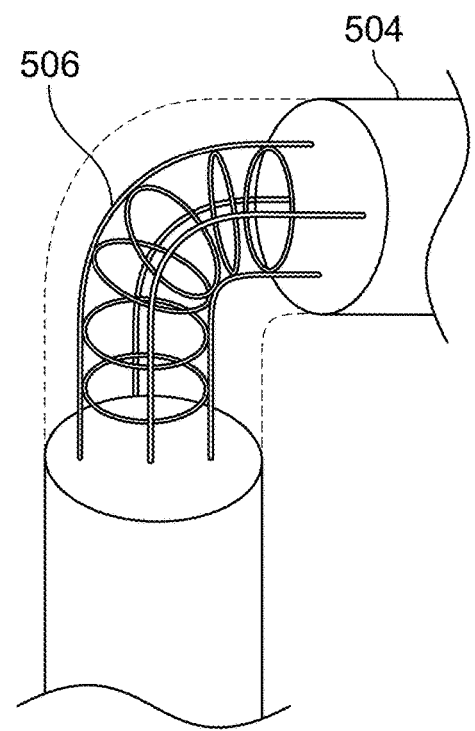

FIGS. 5A and 5B are diagrams illustrating embodiments of complex examples of combined linear and non-linear, connected and unconnected continuous, long fibers placed in HTS reinforcement structures. In the example shown in FIG. 5A, a plurality of fibers such as long, continuous fibers and tying loops/diamonds of fibers 502 are used to reinforce HTS material 500. In the example shown in FIG. 5B, a plurality of fibers such as long, continuous fibers and tying loops of fibers 506 are used to reinforce HTS material 504.

Fiber reinforcement will permit HTS components to be produced cheaply and with precision through the technique of subtractive sculpting. Until now attempts at producing usable HTS components exclusively focused on either creating thin single crystal films through two-dimensional deposition on substrates or bulk three-dimensional HTS crystals in molds or other fixed containers. These methods are expensive, restrict the shape and size of components, and require the custom manufacture of each component to exact specifications making it extremely difficult to physically modify a component after it is produced. Fiber reinforcement strengthens and reduces the brittleness of a bulk HTS allowing parts to be sculpted (i.e., carved, cut, ground or otherwise extracted away) from a block of HTS material without disrupting the superconductivity of the crystal lattice. Thus, an unlimited variety of HTS component geometries can be produced including wires, rods, spirals, films, tapes, plates, blocks, spheres and three dimensional complex forms for use in specific electric and magnetic applications. Subtractive sculpting also allows more precise component manufacture by eliminating geometric uncertainties in thermal expansion/contraction as HTS crystallizes and cools during production. Cooling causes thermal expansion and contraction which is difficult to predict, and varies greatly depending on an HTS crystal's internal cooling temperature gradients and shape. Production using molds and film deposition are prone to such thermal uncertainties since their external reinforcement cannot be easily modified once the HTS crystal has formed. The much greater manufacturing precision provided by subtractive sculpting due to fiber internal reinforcement will allow much less wastage of less-than-perfectly formed HTS components. The efficiency will substantially reduce the cost of fiber reinforced HTS components leading to more commercial applications.

Figure 6:
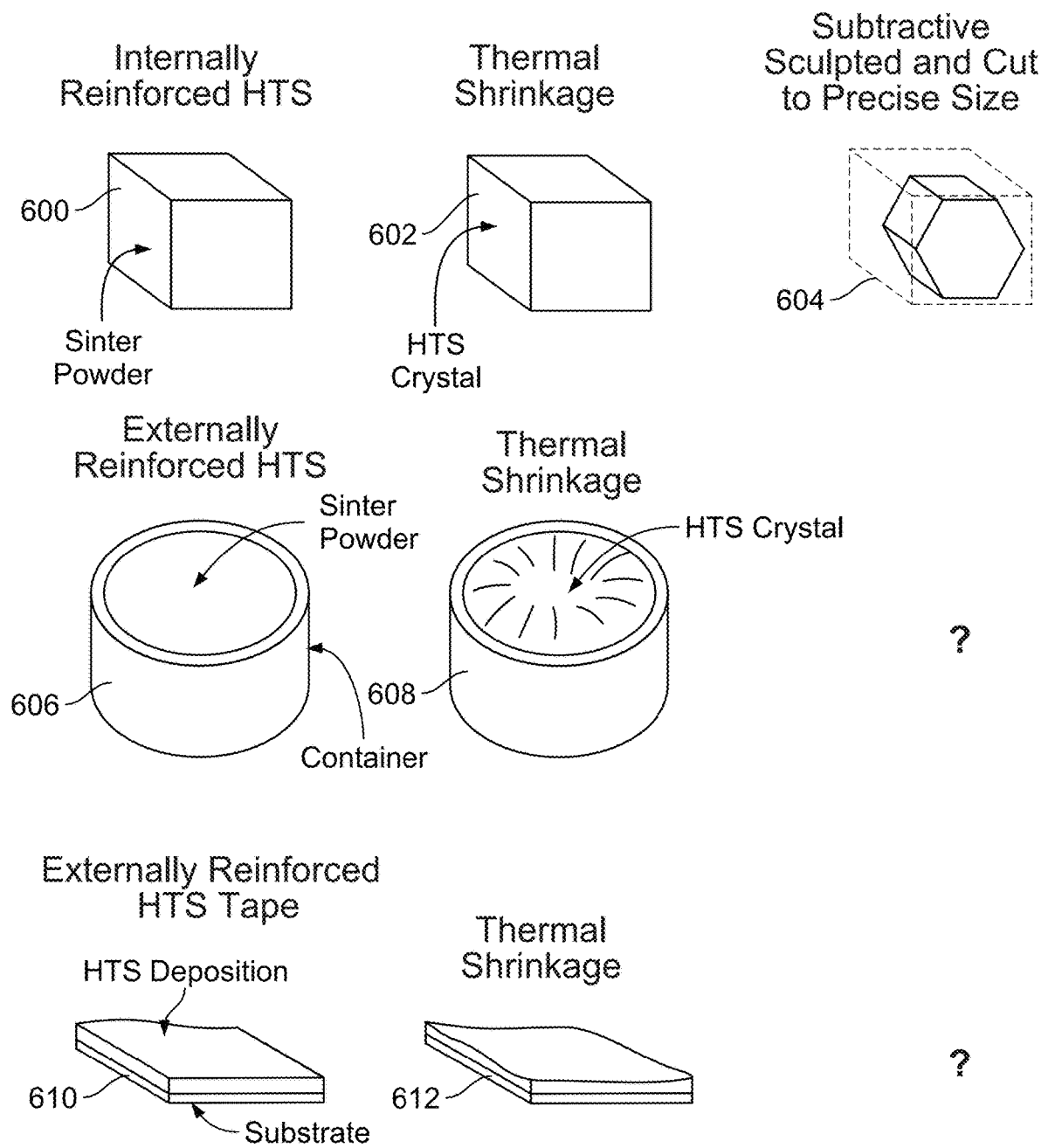
FIG. 6 is a diagram illustrating an embodiment of an example of the efficiencies of the technique of subtractive sculpting made possible by internal fiber reinforcement of HTS compared to external reinforcement in containing structures such as rings, films, tapes, boxes, etc.

FIG. 6 is a diagram illustrating an embodiment of an example of the efficiencies of the technique of subtractive sculpting made possible by internal fiber reinforcement of HTS compared to external reinforcement in containing structures such as rings, films, tapes, boxes, etc. In the example shown, a process for producing a reinforced HTS material is illustrated. For example, powder with reinforcing fibers is sintered in 600, the crystal shrinks as it cools in 602, and the crystal is sculpted (e.g., cut, milled, ground, or otherwise extracted) in 604. In contrast, the process of producing an externally reinforced HTS material is illustrated. For example, powder with external reinforcement (e.g., a container) is sintered in 606, and the crystal shrinks as it cools in 608 potentially weakening the external reinforcement of the HTS crystal. In this example, the shaping of the combination of external reinforcement and HTS crystal is then problematic. Also in contrast, the process of producing an externally reinforced HTS material is illustrated. For example, powder with external reinforcement (e.g., a tape) is deposited in 610, and the crystal shrinks as it cools in 612 potentially weakening the external reinforcement of the HTS crystal. In this example, the shaping of the combination of external reinforcement and HTS crystal is then problematic.

Fiber reinforcement allows a single production block to be cut in to a large number and/or variety of different components. This increases production efficiency and reduces costs leading to more commercial applications.

Fiber reinforcement (e.g., SiC fiber reinforcement) will also make HTS and proto-HTS materials strong enough for Continuous HTS Production which will significantly reduce manufacturing cost leading to HTS use in more applications. Currently, HTS is produced in batches where single bulk crystals or films are first sintered/deposited then allowed to cool under controlled conditions to allow crystal growth. While suitable for research, batch production is inefficient and expensive requiring considerable labor for each batch and leaving most equipment unused during each production run. Continuous HTS Production is a multi-stage process where: 1) fiber reinforcement is placed within a continuous tube sheath at the entrance to the continuous production line, 2) constituent HTS chemicals in sintering powder form are mixed and place with the fiber reinforcement in the tube, 3) the HTS is then packed and heated to sintering temperatures as the tube is moved through a processing oven machine, 4) the tube then moves through a cooling process where a single long HTS crystal continuously forms, 5) once crystallized, the continuous HTS crystal tube is cooled to room temperature, and 6) the HTS tube is then cut at intervals to produce individual bulk single crystal HTS blocks. The individual blocks are then subtractively sculpted into individual components.

Continuous production requires that the single HTS crystal be strong enough to withstand the strains and stresses of continuous movement during production. This is done by placing fiber reinforcement with the sintering component powders in the continuous tube before sintering. The reinforcement reduces the brittleness of and strengthens the HTS such that the continuous tube of HTS can be transported seamlessly through mixing, packing, sintering, cooling, and cutting without breaking the HTS' essential single crystal structure.

Figure 7A:
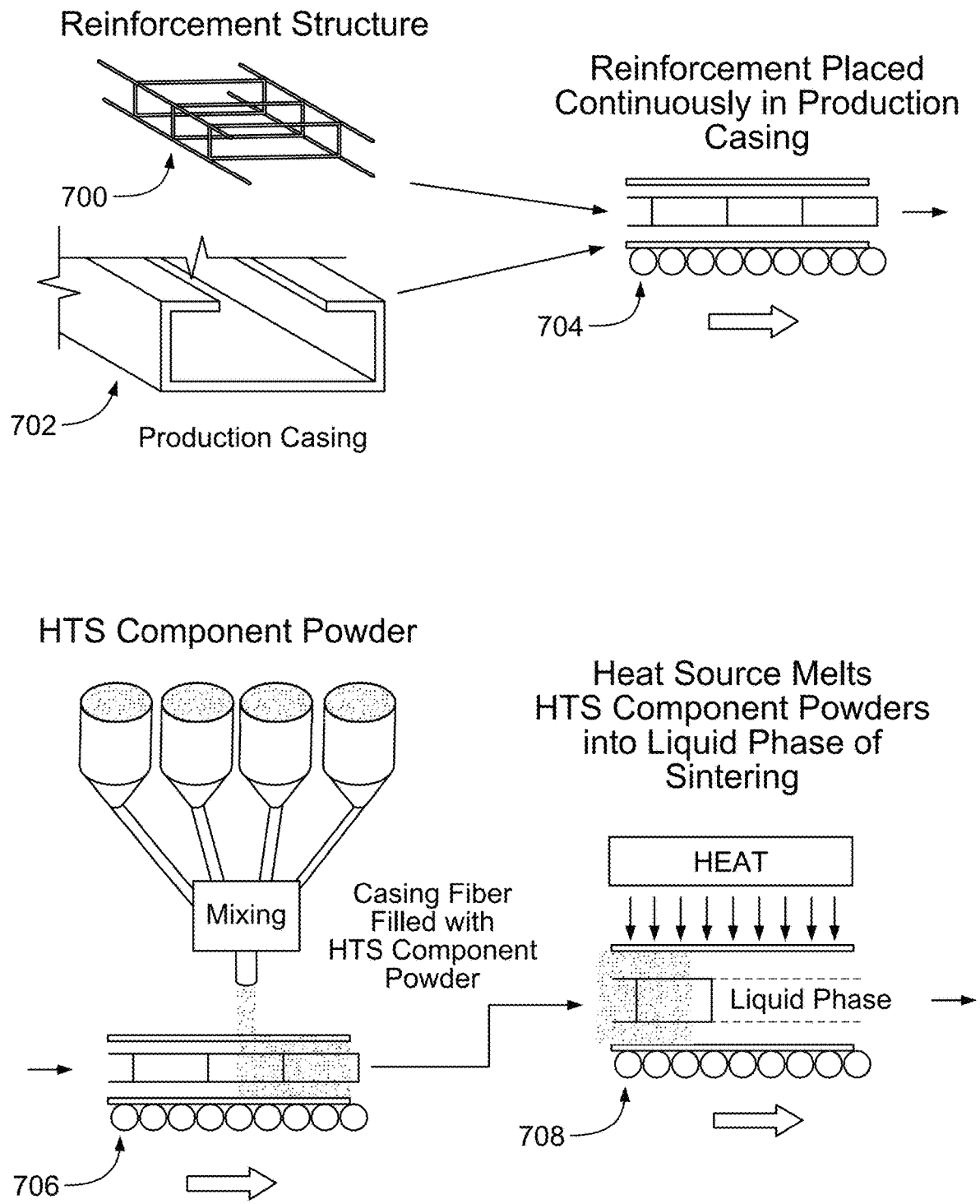
FIGS. 7A and 7B are diagrams illustrate embodiments of a process for Continuous HTS Production using fiber Reinforced HTS.
Figure 7B:
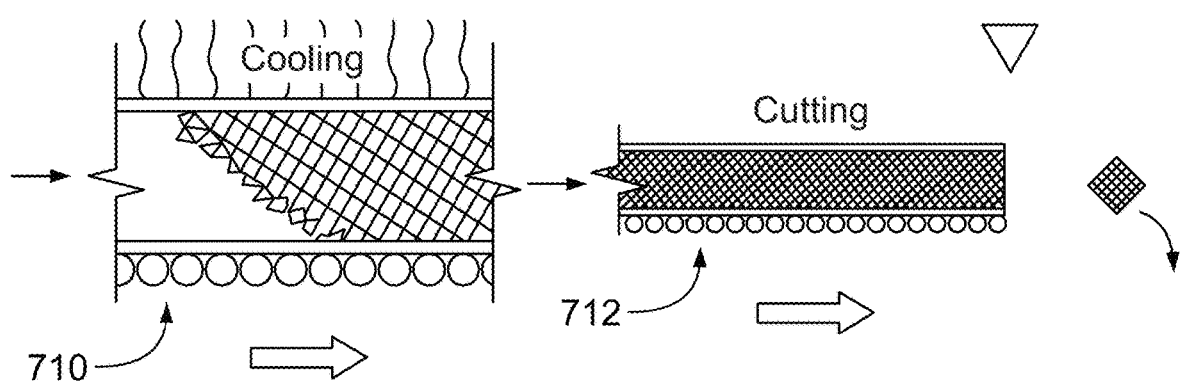

FIGS. 7A and 7B are diagrams illustrate embodiments of a process for Continuous HTS Production using fiber Reinforced HTS. In the example shown, in 700 a fiber reinforcement structure is depicted. In 702, a production casing in which the reinforcement structure is placed is depicted. In 704, the reinforcement structure is continuously placed within the production casing. In 706, the production casing with reinforcement structure is filled with HTS component powder. In 708, the production casing with reinforcement structure and HTS component powder is heated. In 710, the HTS cools and crystallizes. In 712, the continuous crystal is cut into production blocks.

To further strengthen HTS components against brittleness and cracking, fibers can be pre-stressed during sintering and throughout HTS production with specialized processes, equipment, and control mechanisms. The physical principle behind pre-stressing is that a compressive force (F) within the HTS crystal is created by the continuous lateral force induced by the stressed fiber reinforcement. This compressive force increases the external forces (P) which the HTS crystal can bear before cracking.

Pre-stressing involves applying carefully controlled and monitored tension at ends of individual reinforcing fibers before sintering and cooling. After the HTC crystal forms around the fibers, the crystal matrix will hold the fiber and extend the fiber's force completely through the HTS such that tension on the external fiber ends will no longer be needed. External fiber ends can then be trimmed, and the now pre-stressed strengthened HTS can be divided, cut and subtractively shaped into final component shape.

Figure 8:
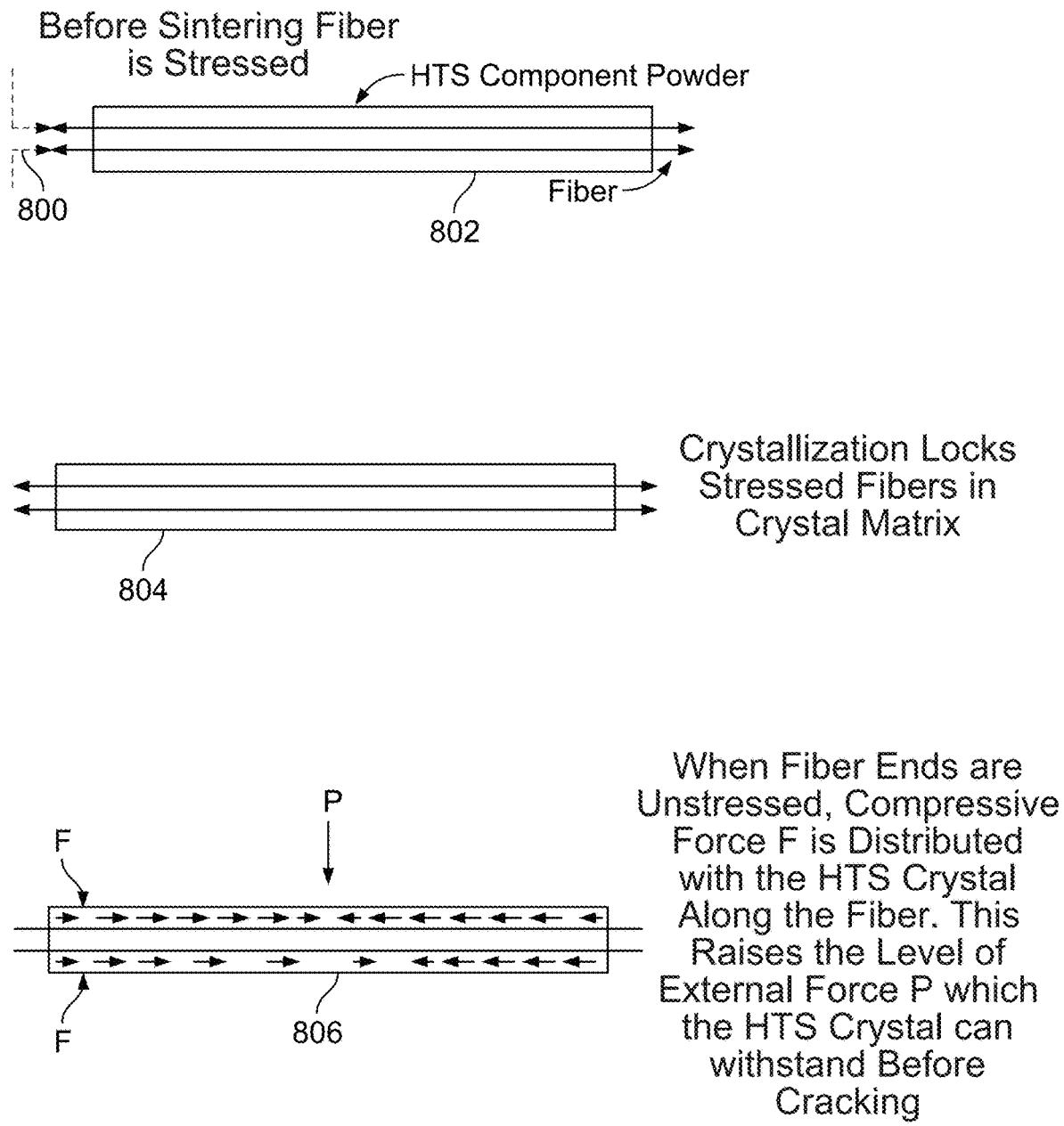
FIG. 8 is a diagram illustrating an embodiment of a process for Pre-stressing fiber in reinforced HTS.

FIG. 8 is a diagram illustrating an embodiment of a process for Pre-stressing fiber in reinforced HTS. In the example shown, fibers 800 are prestressed in HTS powder 802. HTS is heated and crystallized with the prestressed fibers inside shown in 804 and the stress is released. HTS structure 806 is shown prestressed and being able to resist force P.

For batch production, pre-stressing forces would be applied on the external fiber ends sticking out of the HTS before the HTS component powders are added to the reinforcement in the casing at the beginning of the process. At the end of the process after HTS crystal has been formed but before production blocks are cut, lateral tension is maintained by friction rollers in contact directly with the production casing covering the now solid HTS crystal. Pre-stressing tension is maintained as the component powders are added then continued during the sintering and cooling phases of HTS production. Once the HTS crystal is formed, the Pre-stressing tension is released pass the friction rollers. The HTS crystal matrix will now hold the pre-stressed fibers under force throughout the HTS thereby making it much stronger than without pre-stressing.

Figure 9:
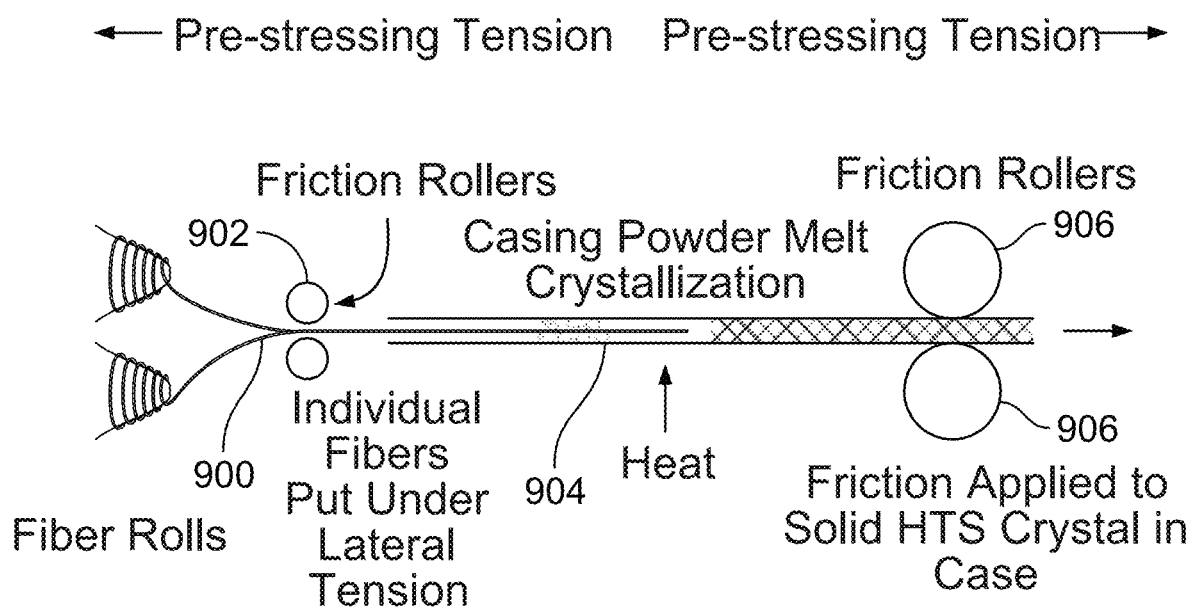
FIG. 9 is a diagram illustrating a process for continuous production with reinforcement fibers.

FIG. 9 is a diagram illustrating a process for continuous production with reinforcement fibers. In the example shown, fibers 900 are fed into friction rollers 902 that enable prestressing. Fibers 900 are fed into casing 904 and powder is added and heated and then cooled to create an HTS crystal. The HTS crystal is held under tension using friction rollers 906. Fibers 900 run laterally along the length of the continuous production line will be pre-stressed with tension at a) at the beginning of the line when fiber reinforcement is placed in the tube casing, and at b) after HTS crystal has fully formed. At the beginning, tension will be applied to each fiber as it is unspooled and placed in the production casing (e.g., using friction rollers 902). This tension will be maintained as the casing and fiber reinforcement is filled with HTS component powder then sintered. After crystallization the HTS crystal matrix will secure the lateral fibers so that the tension applied to lateral fibers from the beginning of the production line can be maintained by friction rollers pressing on the sides of the now solid HTS crystal (e.g., using friction rollers 906). Once past the friction rollers, the pre-stressed HTS can be cooled then divided, cut and subtractively sculpted into final components.

Continuously produced reinforced HTS can be radially pre-stressed by placing fibers perpendicular or at an angle to the axis of the lateral movement of the production tube casing such that individual fiber ends protrude from the casing. The tube is then be filled with HTS component sintering powder. A pre-stressing jig is then assembled around the production casing which secures the ends and provides pre-stressing tension to the radial fiber extruding from the casing. This jig keeps pre-stressing tension on the radial fibers as the HTS is sintered then crystallized and cooled. Once the HTS crystal is formed, the radial fibers are held at force by the crystal matrix. The pre-stressing jig is then disassembled and taken off the casing before the final pre-stressing tension rollers for lateral pre-stressing described above.

Figure 10:
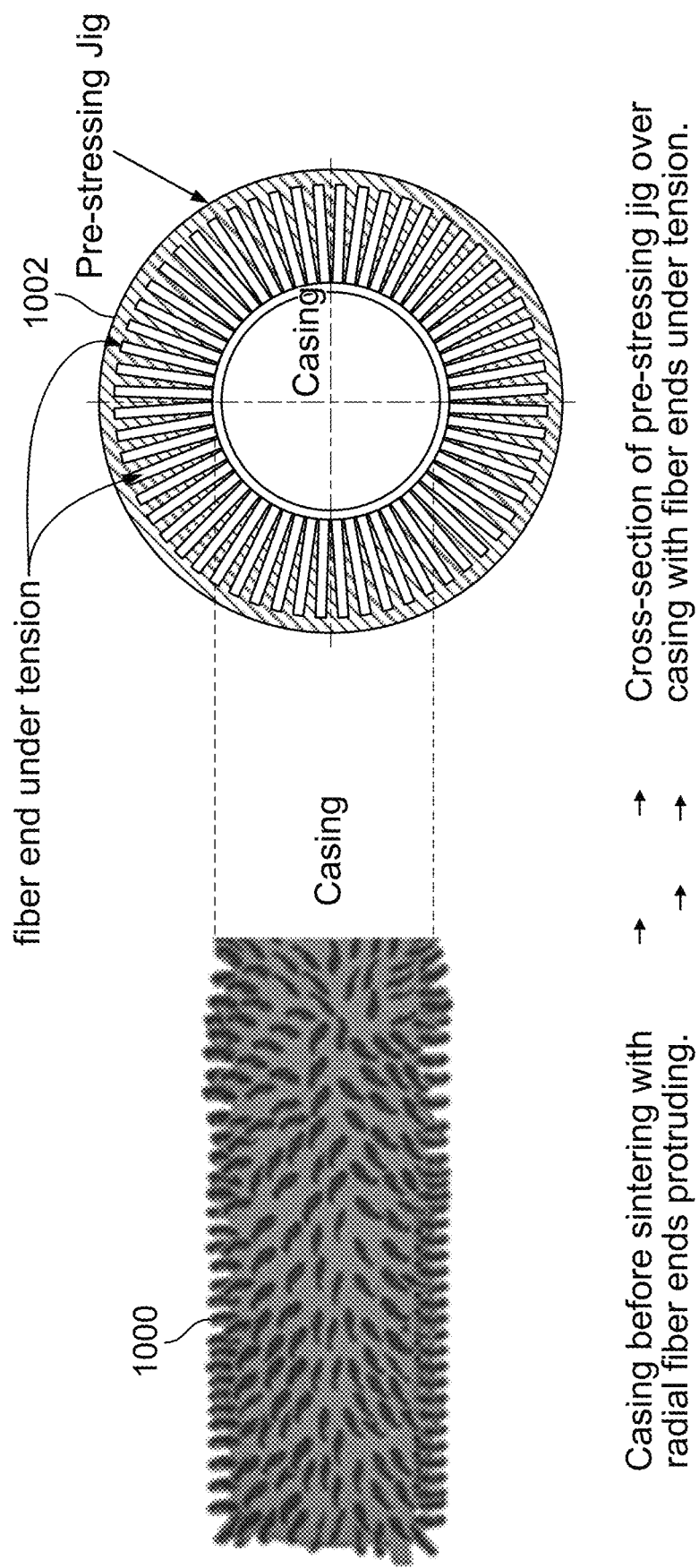
FIG. 10 is a diagram illustrating a process for continuous production with radially pre-stressed fibers.

FIG. 10 is a diagram illustrating a process for continuous production with radially pre-stressed fibers. In the example shown, a casing before sintering with radial fibers protruding is depicted in 1000. In 1002, the Pre-stressing jig is depicted in cross section with radial fibers under tension.

The conductivity and magnetic fields of reinforced HTS components can be controlled by varying the temperature and/or electric current at the external fiber ends of the fibers. This is because both the electrical conductivity and thermal conductivity of fiber differs from HTS. By passing different levels of heat or electric current through different fibers, individual parts of a single HTS component can be subject to more or less heat/electric current than others. This will allow superconductivity to be "turned off" or "turned on" in precise parts of any given HTS component. In addition the heat/current passed through can varied over time allowing dynamic control of micro-magnetic and micro-electric fields across the three spatial dimensions and the fourth dimension of time.

Figure 11:
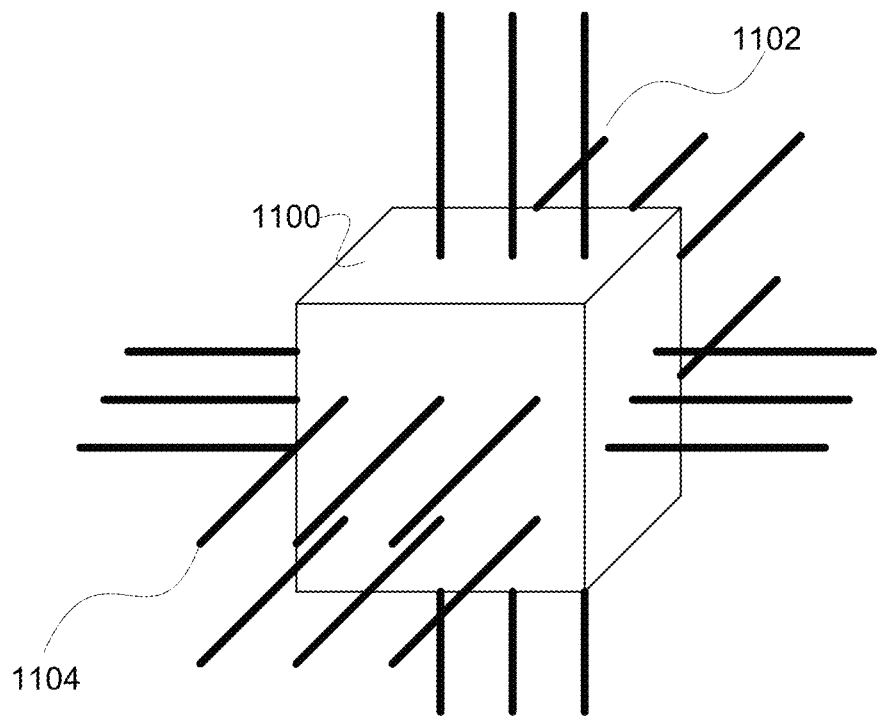
FIG. 11 is a diagram illustrating an embodiment of a reinforced HTS structure.

FIG. 11 is a diagram illustrating an embodiment of a reinforced HTS structure. In the example shown, electrical current or heat/cooling can be delivered through HTS material 1100 using fiber with end 1102 and end 1104. The delivered electrical current or heat/cooling through individual fibers allows four dimensional control of individual parts of an HTS component over three spatial dimensions and the fourth dimension of time. In some embodiments, the fiber reinforcement matrix is used to remove excess HTS heat which is often causes HTS components to lose superconductivity and fail in applications. Heat would be removed by exposing the external fiber ends to temperatures at or below superconductivity operating temperatures (e.g. the temperature of liquid nitrogen). This efficient cooling process will increase the potential commercial applications of HTS components where excess heat generation causes HTS to fail. In some embodiments, electric currents can be selectively guided using the fibers and their intersections within HTS 1100 to activate embedded devices, if appropriate.

Figure 12:
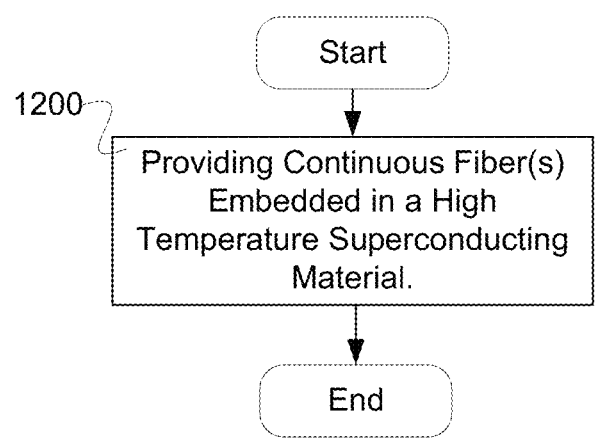
FIG. 12 is a flow diagram illustrating an embodiment of a process for providing an HTS reinforced material.

FIG. 12 is a flow diagram illustrating an embodiment of a process for providing an HTS reinforced material. In the example shown, in 1200 continuous fiber(s) embedded in an HTS material are provided. In various embodiments, the continuous fiber(s) are pre-stressed, are in parallel lines, are connected, are unconnected, are arranged in 2 dimensional or 3 dimensional meshes, nets, arrays, hoops, spirals, rectangles, squares, and/or any other appropriate shapes. In various embodiments, the continuous fiber(s) embedded in an HTS material is batch produced, is continuously produced, is shaped, is cut, is shaped, is ground, is milled, and/or any other appropriate manner of producing the continuous fiber(s) embedded in an HTS material.

Figure 13:
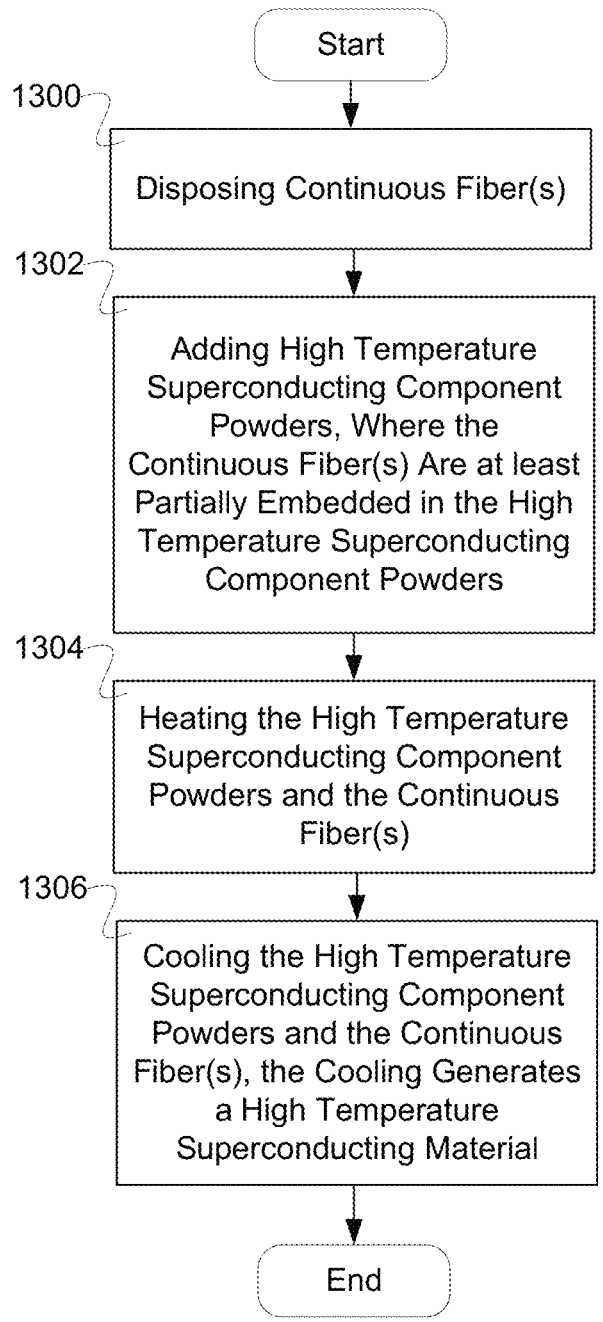
FIG. 13 is a flow diagram illustrating an embodiment of a process for producing an HTS reinforced material.

FIG. 13 is a flow diagram illustrating an embodiment of a process for producing an HTS reinforced material. In the example shown, in 1300 continuous fiber(s) are disposed. In 1302, high temperature superconducting component powders are added, where the continuous fiber(s) are at least partially embedded in the high temperature superconducting component powders. In 1304, the high temperature superconducting component powders and the continuous fiber(s) are heated. In 1306, the high temperature superconducting component powders and the continuous fiber(s) are cooled, where the cooling generates a high temperature superconducting material.

In various embodiments, features of the reinforced HTS material include:

using continuous, long fiber silicon carbide fiber to reinforce HTS to prevent contamination during crystal formation and cracking of the HTS crystal;

using unconnected continuous, long fibers placed in arrays to reinforce and strengthen HTS; and using connected continuous, long fibers placed in two and three dimensional reinforcement structures.

In various embodiments, reinforced HTS material are produced using:

Subtractive sculpting, where HTS material is extracted through a sculptive process rather than the additive process of external molding and film/tape deposition which will increase production efficiency and reduce costs leading to more commercial applications;

Cutting and dividing single HTS blocks into a large number and/or variety of different components which will increase production efficiency and reduce costs leading to more commercial applications;

Continuously producing HTS to significantly reduce production cost and time compared to current batch production;

Pre-stressing HTC during crystal formation in batch production to increase strength;

Pre-stressing HTC laterally during crystal formation in continuous production to increase HTS strength; and Pre-stressing HTC radially during crystal formation in continuous production to increase HTS strength.

In some embodiments, reinforced HTS materials enable micro-control of electric and magnetic fields over three spatial dimensions as well as time (4D) by using a matrix of Reinforcement fibers to turn off and on individual parts of an HTS components by transmitting heat or electricity through the ends of reinforcement fibers which extend beyond the HTS component.

In some embodiments, reinforced HTS materials enable preventing the overheating of HTS by cooling the ends of the fiber reinforcement fibers which extend beyond the HTS component to avoid the heating of HTS above superconducting temperatures.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    disposing one or more continuous fibers, wherein the one or more continuous fibers are at least partially embedded in high temperature superconducting component powders, wherein a fiber of the one or more continuous fibers comprises a curved fiber that comprises a hoop or a spiral;
    heating the high temperature superconducting component powders and the one or more continuous fibers; and
    cooling the high temperature superconducting component powders and the one or more continuous fibers, wherein the cooling generates a high temperature superconducting material.

2. The method as in claim 1, wherein the one or more continuous fibers comprise SiC fibers.

3. The method as in claim 1, wherein the one or more continuous fibers comprise fibers of one of the following materials: Silicon (Si), Silicon Nitride ($Si_3N_4$), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminium (Al), Aluminum Carbide ($Al_4C_3$), Aluminium Nitride (AlN), Titanium Aluminium Nitride (TiAlN), or Aluminium Titanium Nitride (AlTiN).

4. The method as in claim 1, wherein the high temperature superconducting material has zero electrical resistance at a temperature above 25° K.

5. The method as in claim 1, wherein the high temperature superconducting material comprises ceramic material.

6. The method as in claim 1, wherein the high temperature superconducting material comprises one of the following: copper oxide material, an iron arsenide material, or an iron selenide material.

7. The method as in claim 1, wherein the high temperature superconducting material comprises one of the following: a LaBaCuO material, a LaSrCuO material, a LaSrCaCuO material, a YBaCuO material, a BiSrCaCuO material, or a TiBaCaCuO material, a HgBACaCuO material, a HgTiBaCaCuO material, a LnFeAs (O,F) material, a (Ba, K, Li, Na) FeAs material, a FeSe material, a MgB material, a BKBO material, a RbCsC material, a YbPdBC material, or a NbGe material.

8. The method as in claim 1, wherein the one or more continuous fibers are arranged in a non-linear geometry.

9. The method as in claim 8, wherein the non-linear geometry comprises a fiber along an axis of the hoop or the spiral.

10. The method as in claim 8, wherein the non-linear geometry comprises two fibers that are unconnected.

11. The method as in claim 8, wherein the non-linear geometry comprises two fibers that are arranged along parallel lines.

12. The method as in claim 8, wherein the non-linear geometry comprises two fibers that are arranged along parallel curves.

13. The method as in claim 1, wherein the high temperature superconducting material is shaped using subtractive cutting.

14. The method as in claim 1, wherein the high temperature superconducting material is shaped using cutting and dividing.

15. The method as in claim 1, wherein the high temperature superconducting material is produced using a continuous process.

16. The method as in claim 1, wherein the high temperature superconducting material is produced using a batch process.

17. The method as in claim 1, wherein the one or more fibers are pre-stressed during manufacturing.

* * * * *